United States Patent
Mizumura et al.

(10) Patent No.: US 9,122,171 B2
(45) Date of Patent: Sep. 1, 2015

(54) EXPOSURE APPARATUS

(75) Inventors: Michinobu Mizumura, Yokohama (JP); Kazushige Hashimoto, Yokohama (JP); Makoto Hatanaka, Yokohama (JP)

(73) Assignee: V TECHNOLOGY CO., LTD., Yokohama-shi (JP)

(*) Notice: Subject to any disclaimer, the term of this patent is extended or adjusted under 35 U.S.C. 154(b) by 629 days.

(21) Appl. No.: 13/483,751

(22) Filed: May 30, 2012

(65) Prior Publication Data

US 2012/0236283 A1    Sep. 20, 2012

Related U.S. Application Data

(63) Continuation of application No. PCT/JP2010/069974, filed on Nov. 10, 2010.

(30) Foreign Application Priority Data

Dec. 3, 2009    (JP) .................................. 2009-275455

(51) Int. Cl.
G03B 27/54    (2006.01)
G03B 27/42    (2006.01)
G03F 7/20     (2006.01)

(52) U.S. Cl.
CPC .................................. G03F 7/70275 (2013.01)

(58) Field of Classification Search
CPC ............ G03F 7/70275; G03F 7/70216; G03F 7/70791
USPC ....................................................... 355/67, 53
See application file for complete search history.

(56) References Cited

U.S. PATENT DOCUMENTS

2010/0195078 A1    8/2010    Horiuchi et al.

FOREIGN PATENT DOCUMENTS

| JP | 9-244255 A    | 9/1997  |
| JP | 2008-076709 A | 4/2008  |
| JP | 2008-176257 A | 7/2008  |
| JP | 2009-058666 A | 3/2009  |
| JP | 2009-277900 A | 11/2009 |

OTHER PUBLICATIONS

Machine translation of Goto et al. JP 09-244255, Sep. 19, 1997.*

* cited by examiner

*Primary Examiner* — Peter B Kim
(74) *Attorney, Agent, or Firm* — Foley & Lardner LLP

(57) ABSTRACT

Exposure apparatus includes photomasks on which a mask pattern having the same shape as that of an exposure pattern exposed onto a surface of a TFT substrate held on a stage is formed, lens assemblies in which unit lens groups in each of which a plurality of convex lenses are arranged in a normal direction to the photomasks so that same-size erect images of mask patterns formed on the photomasks can be formed on the surface of the TFT substrate are arranged in a plane parallel with the photomasks and the surface of the TFT substrate held on the stage, and moving device that moves the lens assemblies in a plane parallel with the masks and the surface of TFT substrate held on the stage.

10 Claims, 13 Drawing Sheets

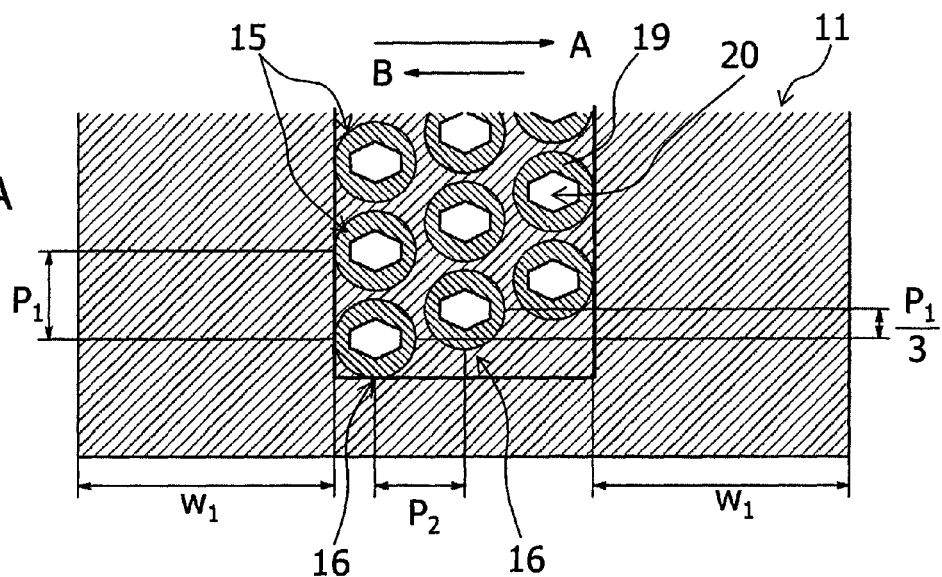
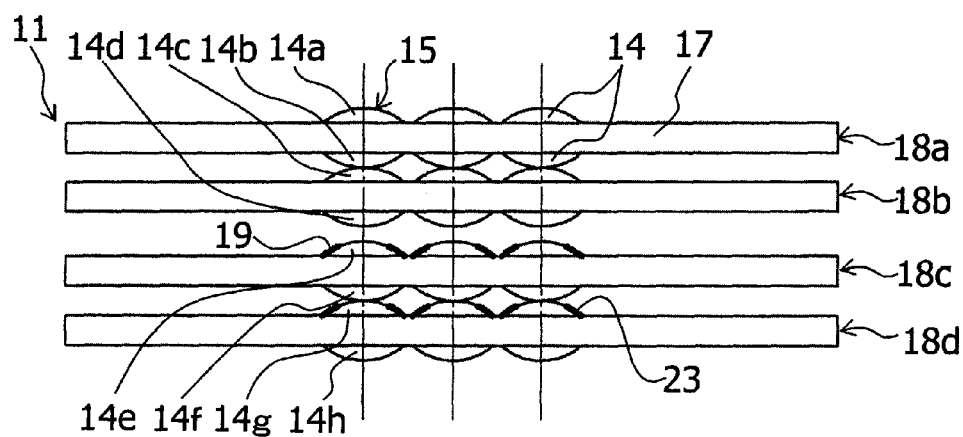

EXPOSURE APPARATUS

This application is a continuation of PCT/JP2010/069974, filed on Nov. 10, 2010.

BACKGROUND OF THE INVENTION

1. Field of the Invention

The present invention relates to an exposure apparatus for applying exposure light to an object to be exposed held on a stage through a photomask and forming a predetermined pattern by exposure, in particular, to an exposure apparatus for exposing an image of non-periodic pattern on a large area object to be exposed with high resolving power.

2. Description of Related Art

A conventional exposure apparatus is an exposure apparatus which intermittently irradiates exposure light to an object to be exposed conveyed at a constant speed through a photomask and exposes an image of a mask pattern of the photomask at a predetermined position. The conventional exposure apparatus includes a first imaging device arranged to capture an image of an exposure position by the photomask or a position upstream of the exposure position in a conveying direction of the object to be exposed and the first imaging device having a plurality of light receiving elements arranged in a direction substantially perpendicular to the conveying direction, a second imaging device arranged to capture an image of the exposure position by the photomask or a position upstream of the exposure position in a conveying direction of the object to be exposed and the second imaging device having a plurality of light receiving elements arranged in substantially parallel with the conveying direction, an alignment device which relatively moves the object to be exposed and the photomask in a direction substantially perpendicular to the conveying direction to correct the exposure position by the photomask, and a control device which controls drive of the alignment device on the basis of a first reference position for correcting the exposure position provided on the object to be exposed in advance when the first reference position is detected by the first imaging device and controls irradiation timing of exposure light on the basis of a second reference position for extracting the irradiation timing of exposure light provided on the object to be exposed in advance when the second reference position is detected by the second imaging device (for example, refer to Japanese Laid-Open Patent Application No. 2008-76709).

However, in the conventional exposure apparatus as described above, although a periodic pattern is easily exposed to the object to be exposed (substrate) by only controlling the irradiation timing of exposure light at a predetermined cycle while conveying the substrate in one direction at a constant speed, it is difficult to perform exposure of non-periodic pattern. Furthermore, in the conventional exposure apparatus, the photomask and the substrate are allowed to be disposed proximately to each other, and then, an image of a pattern formed on the photomask is exposed onto the substrate. Thus, an image of pattern on the substrate is blurred and resolution is deteriorated due to the presence of a collimation half angle in light from a light source irradiated to the photomask, so that there is a possibility that a fine pattern may not be formed by exposure.

Although such a problem can be solved by using a stepper exposure apparatus which performs exposure by projecting a reduced image of a mask pattern of the photomask onto the substrate by an imaging lens, when exposure is performed on a large area substrate of 1 m by 1 m, for example, there is a problem that the diameter of the lens to be used becomes large and expensive according to the size of the substrate.

SUMMARY OF THE INVENTION

Therefore, in view of the above conventional problems, an object of the present invention is to provide an exposure apparatus for exposing an image of non-periodic pattern on a large area object to be exposed with high resolving power.

In order to achieve the above object, the exposure apparatus according to an aspect of the present invention includes a photomask on which a mask pattern having the same shape as that of an exposure pattern exposed onto a surface of an object to be exposed held on a stage is formed, a lens assembly which is disposed between the photomask and the stage and in which a plurality of unit lens groups in each of which a plurality of convex lenses are arranged in a normal direction to the photomask so that a same-size erect image of the mask pattern formed on the photomask can be formed on the surface of the object to be exposed are arranged in a plane parallel with the photomask and the surface of the object to be exposed held on the stage, and a moving device that moves the lens assembly in a plane parallel with the photomask and the surface of the object to be exposed held on the stage.

By the configuration described above, the lens assembly which is disposed between the photomask and the stage and in which a plurality of unit lens groups in each of which a plurality of convex lenses are arranged in a normal direction to the photomask are arranged in a plane parallel with a surface of the object to be exposed held on the photomask and the stage is moved in a plane parallel with the photomask and the stage by the moving device, the same-size erect image of the mask pattern formed on the photomask is formed on the surface of the object to be exposed held on the stage by the lens assembly, and the object to be exposed is exposed to a predetermined pattern.

Preferably, the lens assembly is an assembly in which a plurality of lens columns in each of which a plurality of the unit lens groups are arranged at a predetermined pitch in a direction perpendicular to a moving direction of the lens assembly are provided at a predetermined pitch in the moving direction and each lens column is shifted from an adjacent lens column by a predetermined distance in an arrangement direction of the unit lens groups so that a part of each unit lens group of each lens columns overlaps each other as seen from the moving direction.

More preferably, the lens assembly is formed by overlapping a first, a second, a third, and a fourth lens arrays, in each of which a plurality of convex lenses are formed on both surfaces of a transparent substrate in a state in which the convex lenses on the upper surface and the convex lenses on the lower surface correspond to each other, in a state in which corresponding convex lenses have the same optical axis, and the lens assembly is formed so that an intermediate inverted image of the mask pattern of the photomask is formed between the second lens array and the third lens array.

Furthermore, the lens assembly includes a first aperture stop including an opening having a predetermined shape near a surface of a convex lens located on the upstream side of a light propagation direction of the third lens array, so that an exposure area by the unit lens is limited to a central portion of the lens.

Also, the opening of the first aperture stop has a shape, a part of which is a light-shielding portion, so that, in an opening having a rectangular shape in a planar view, an area of a portion overlapping a part of an opening of an adjacent first aperture stop as seen from the moving direction of the lens assembly is a half of the entire area of the overlapping portion.

Furthermore, the lens assembly includes a second aperture stop limiting a diameter of light flux near a surface of a lens on the upstream side of the light propagation direction of the fourth lens array.

Preferably, the stage can carry and convey the object to be exposed in one direction and the moving device moves the lens assembly in a state in which movement of the stage is stopped.

More preferably, the exposure apparatus further includes another photomask in which a plurality of other mask patterns are formed by arranging the mask patterns in at least one column at predetermined intervals in a direction perpendicular to the conveying direction of the object to be exposed on a light-shielding film formed on one surface of a transparent substrate above the stage at the upstream side of the abovementioned photomask in the conveying direction of the object to be exposed, and light from light source is intermittently irradiated to the other photomask at predetermined time intervals and images of the mask patterns are exposed to the object to be exposed that is being conveyed at a constant speed at a predetermined cycle.

Furthermore, the other photomask is an photomask in which two mask pattern groups including two types of mask patterns having different required resolving powers are formed on a light-shielding film formed on a surface of a transparent substrate opposite to a surface facing the object to be exposed along the conveying direction of the object to be exposed and microlenses which project a reduced image of a mask pattern corresponding to a mask pattern having higher required resolving power of the two types of mask patterns having different required resolving powers onto the object to be exposed, are formed on the surface facing the object to be exposed.

Furthermore, a mask pattern group including the mask pattern having high required resolving power includes a plurality of mask pattern columns formed by linearly aligning the plurality of mask patterns at a predetermined pitch in a direction substantially perpendicular to the conveying direction of the object to be exposed, and in order to be able to complement spaces between a plurality of exposure patterns formed by a mask pattern column located downstream in the conveying direction of the object to be exposed with a plurality of exposure patterns formed by a subsequent mask pattern column, the subsequent mask pattern column is formed by being shifted by a predetermined distance in an alignment direction of the plurality of mask patterns.

Preferably, the object to be exposed is a thin film transistor substrate of a display apparatus. The other photomask is used to expose in a central display area of the thin film transistor substrate images of the two types of mask patterns having different required resolving powers at a predetermined cycle, a mask pattern having higher required resolving power of the two types of mask patterns having different required resolving powers is an electrode wiring mask pattern of a thin film transistor, and a mask pattern having lower required resolving power is a mask pattern for signal lines and scanning lines which supply signals to the thin film transistor. The photomask includes a mask pattern for terminals connected to the signal lines or the scanning lines in an area outside the display area of the thin film transistor substrate.

According to a first aspect of the invention, a lens assembly formed so that a same-size erect image of the mask pattern formed on the photomask can be formed on the surface of the object to be exposed can be exposed while the lens assembly is being moved in parallel with the surface of the photomask, so that even when the mask pattern is a non-periodic pattern, exposure with high resolving power can be performed. In this case, the size of the lens assembly may be smaller than that of the photomask. Therefore, even when the size of the photomask becomes large to handle a large area object to be exposed, it is possible to reduce the size of the lens assembly to be used and the cost of components can be reduced. Thereby, the manufacturing cost of the apparatus can be reduced.

Furthermore, according to a second aspect of the invention, even when a mask pattern, the size of which is larger than the lens, is used, exposure can be continuously performed without interruption.

Furthermore, according to a third aspect of the invention, a lens assembly in which a plurality of unit lenses are arranged in a plane can be easily formed. Therefore, the manufacturing cost of the lens assembly can be reduced.

Furthermore, according to a fourth aspect of the invention, the same-size erect image of the mask pattern of the photomask can be accurately formed on the surface of the object to be exposed while eliminating the effect of lens aberration. Therefore, the accuracy in forming an exposure pattern can be improved.

Furthermore, according to a fifth aspect of the invention, even when repeated exposure is performed to connect exposure patterns, over exposure can be prevented. Therefore, the accuracy in forming an exposure pattern can be further improved.

Furthermore, according to a sixth aspect of the invention, the diameter of light flux can be limited, so that the resolving power by the unit lens group of the lens assembly can be further improved.

Furthermore, according to a seventh aspect of the invention, exposure can be performed while the objects to be exposed are continuously supplied, so that the efficiency of the exposure process can be improved.

Furthermore, according to an eighth of the invention, a non-periodic exposure pattern and a periodic exposure pattern can be formed in the same exposure process.

Furthermore, according to a ninth aspect of the invention, even when exposure patterns in which two types of exposure patterns having different required resolving powers are mixed is formed on the object to be exposed, the two types of exposure patterns can be formed in the same exposure process at the same time, so that the efficiency of the exposure process can be improved.

Furthermore, according to a tenth aspect of the invention, even when the arrangement pitch of a plurality of mask patterns in a mask pattern column cannot be reduced due to the presence of the microlenses, spaces between a plurality of exposure patterns formed by the mask pattern column located downstream in the conveying direction of the object to be exposed are complemented with a plurality of exposure patterns formed by the subsequent mask pattern column. Therefore, an exposure pattern having high required resolving power can be densely formed.

Then, according to an eleventh aspect of the invention, an electrode wiring exposure pattern of a thin film transistor in which high resolution power is required and exposure patterns of signal lines and scanning lines in which resolving power may be low are formed at a predetermined cycle in the central display area of a thin film transistor substrate of the display apparatus, and a non-periodic terminal exposure pattern connected to the exposure pattern of signal lines or scanning lines can be formed in an area outside the display area in the same exposure process. Therefore, a wiring pattern of a thin film transistor substrate can be efficiently formed.

BRIEF DESCRIPTION OF THE DRAWINGS

FIGS. 5A and 5B are views showing a configuration example of a signal terminal lens assembly used in the exposure apparatus of the present invention, in which FIG. 5A is a plan view of the signal terminal lens assembly of FIG. 1, FIG. 5B is a front view of the signal terminal lens assembly of FIG. 1;

FIG. 10A is a plan view. FIG. 10B is a front view;

FIG. 13A shows an example of signal terminal photomasks, FIG. 13B shows an example of scanning terminal photomasks.

DESCRIPTION OF THE PREFERRED EMBODIMENTS

Figure 1:
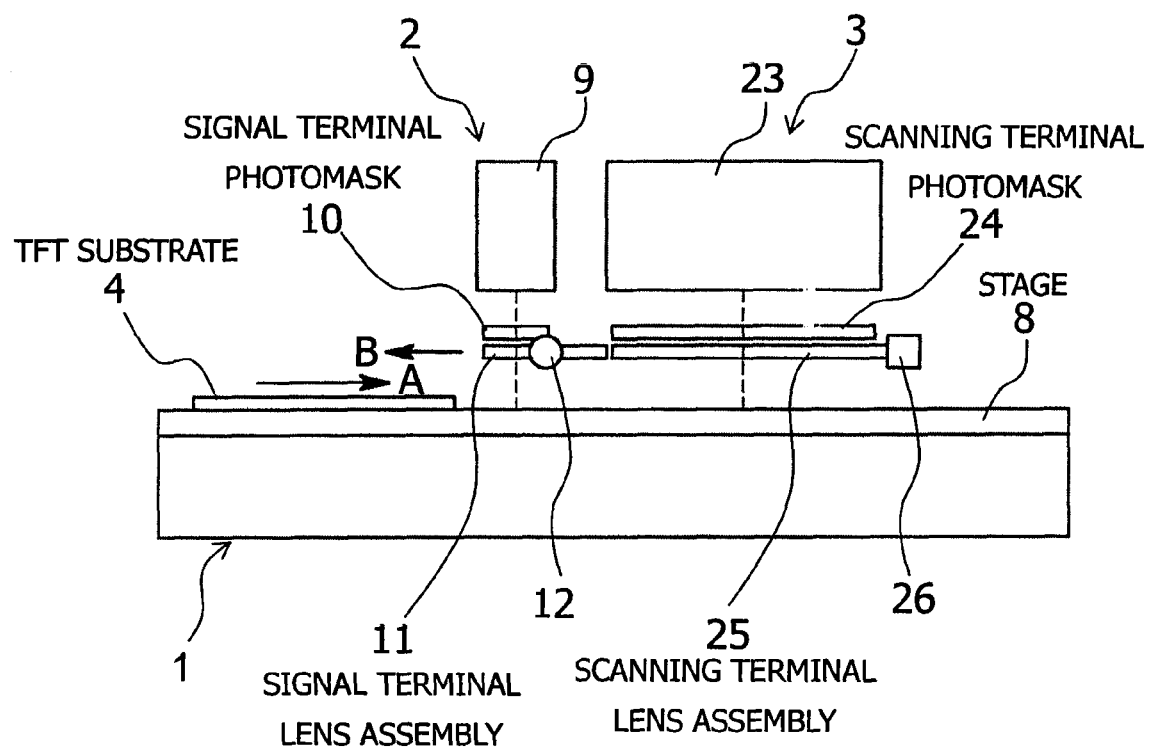
FIG. 1 is a front view showing an embodiment of an exposure apparatus according to the present invention.
Figure 2:
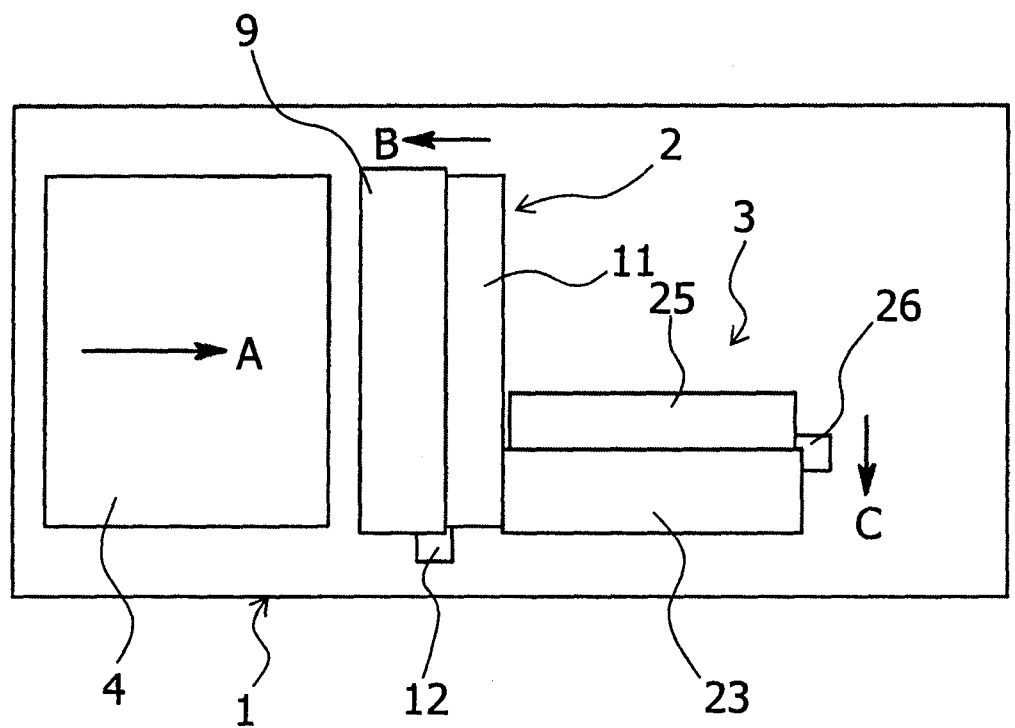
FIG. 2 is a plan view of FIG. 1.

Hereinafter, an embodiment of the present invention will be described in detail with reference to the attached drawings. FIG. 1 is a front view showing an embodiment of an exposure apparatus according to the present invention. FIG. 2 is a plan view of FIG. 1. The exposure apparatus can perform exposure an image of non-periodic pattern on a large area object to be exposed with high resolving power. The exposure apparatus includes a conveying device 1, a first exposure optical unit 2, and a second exposure optical unit 3. In the description below, a case will be described in which the object to be exposed is a thin film transistor (hereinafter referred to as "TFT") substrate of a display apparatus.

Figure 3:
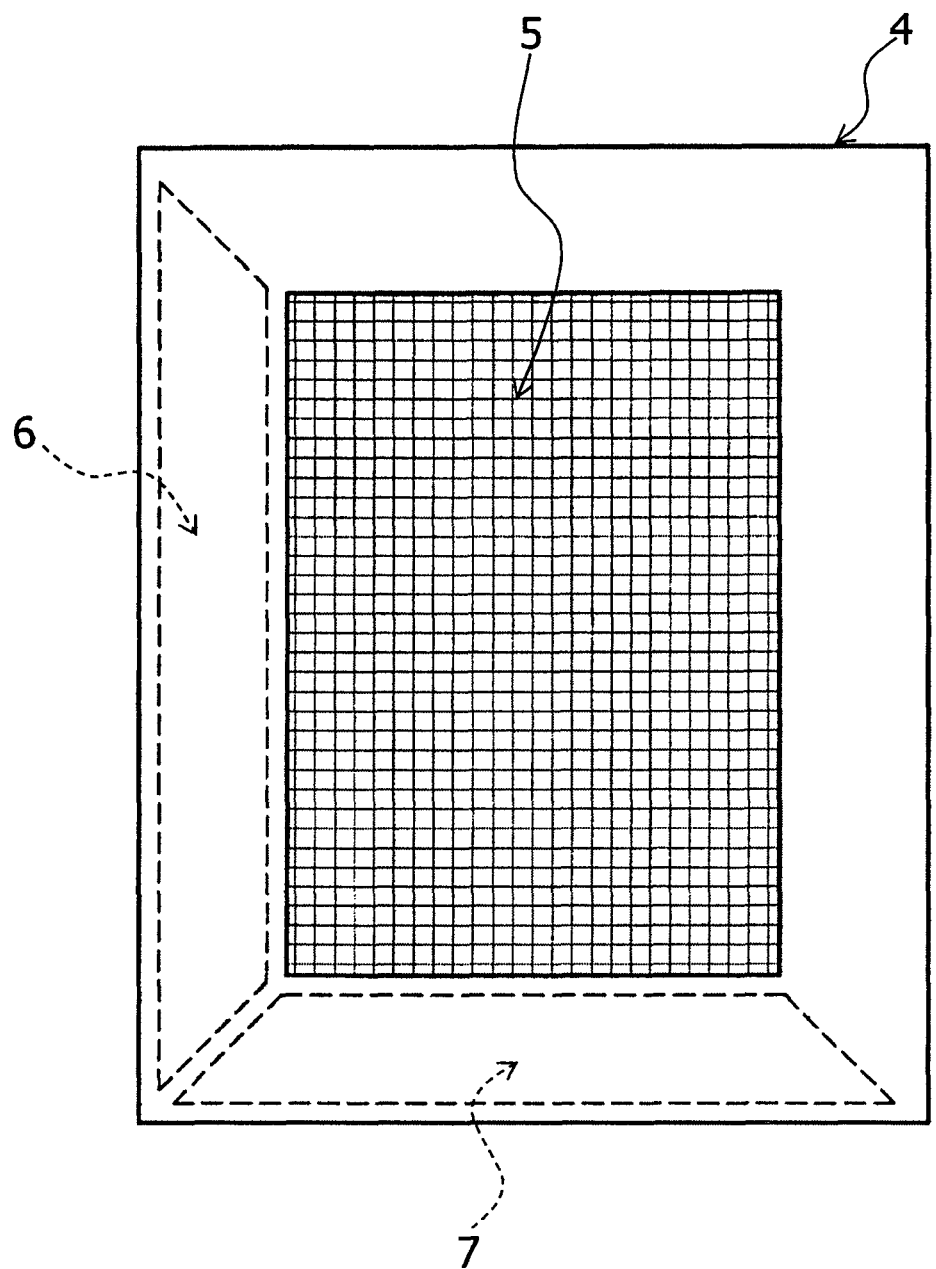
FIG. 3 is a plan view showing a thin film transistor substrate used in the exposure apparatus of the present invention.

FIG. 3 is a plan view showing a TFT substrate 4 used in the present invention. Another exposure apparatus forms an exposure pattern in which a plurality of signal lines and a plurality of scanning lines crisscross at predetermined cycle in a display area 5, so that the TFT substrate 4 is formed. An area 6 enclosed by a dashed line outside the display area 5 is an area in which signal terminals that connect a plurality of signal lines to a signal drive circuit provided outside are formed. An area 7 is an area in which scanning terminals that connect a plurality of scanning lines to a scanning drive circuit provided outside are formed.

The conveying device 1 conveys a stage 8 in one direction (direction indicated by an arrow A shown in FIG. 1), on an upper surface of the stage 8, the TFT substrate 4 on which a photosensitive resin is coated is placed. The conveying device 1 moves the stage 8 by a moving mechanism including, for example, a motor, a gear, and the like. Furthermore, gas ejecting holes and gas drawing holes are provided on the surface of the stage 8 and the TFT substrate 4 may be conveyed while the TFT substrate 4 is floated from the stage 8 by a predetermined distance by balancing the ejecting force and the drawing force of the gas. The conveying device 1 is provided with a position sensor (not shown) for measuring a moving distance of the stage 8.

The first exposure optical unit 2 is provided above the conveying device 1. The first exposure optical unit 2 exposes an image of a pattern of signal terminals on the signal terminal forming area 6 of the TFT substrate 4 and includes a light source device 9, a signal terminal photomask 10, a signal terminal lens assembly 11, and a moving device 12.

Here, the light source device 9 irradiates parallel light having a uniform brightness distribution to the signal terminal photomask 10 described later. The light source device 9 includes, for example, a light source such as an extra high pressure mercury lamp and a xenon lamp, a photo integrator for uniformizing the brightness distribution of the light irradiated from the light source, and a condenser lens for converting the light, of which brightness distribution is uniformized, into parallel light.

Figure 4:
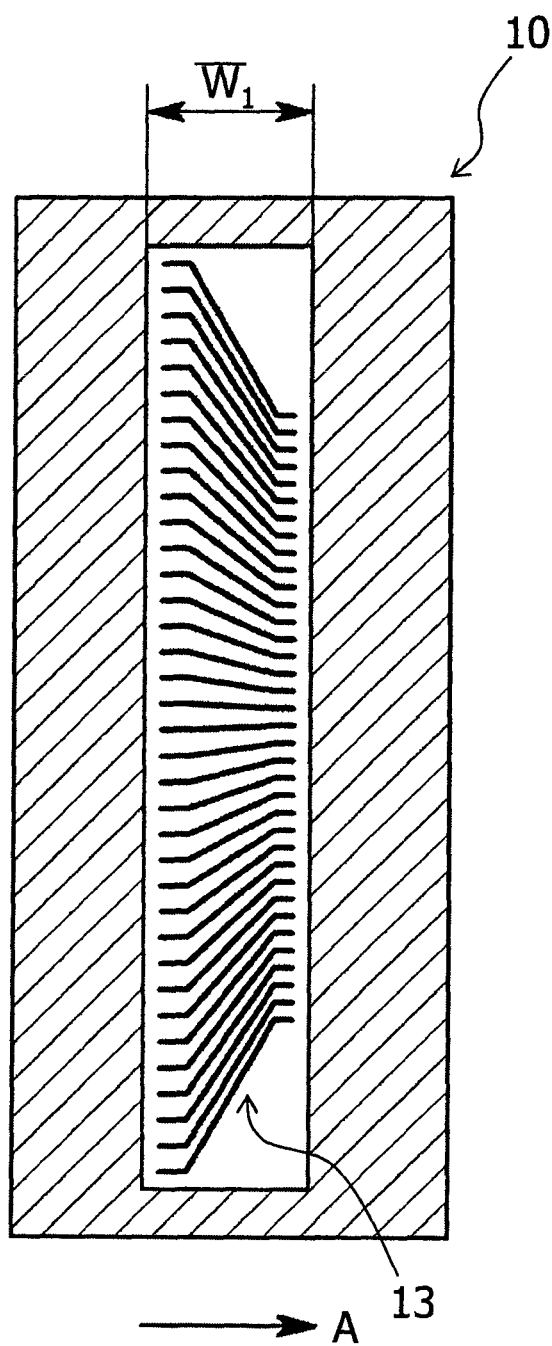
FIG. 4 is a plan view showing a configuration example of a signal terminal photomask used in the exposure apparatus of the present invention.

The signal terminal photomask 10 is provided on the downstream side of the light of the light source device 9. As shown in FIG. 4, the signal terminal photomask 10 is obtained by forming a signal terminal mask pattern 13 having the same shape as that of the signal terminals on a surface of a transparent substrate. The signal terminal photomask 10 is held on a mask stage not shown with the surface on which the signal terminal mask pattern 13 is formed facing down. The signal terminal photomask 10 is classified into a positive type and a negative type according to the type of photosensitive resin to be used. Here, a case in which the signal terminal photomask 10 is positive type will be described. Therefore, the signal terminal mask pattern 13 is formed of an opaque film and light passes through an area outside the signal terminal mask pattern 13.

The signal terminal lens assembly 11 is provided between the signal terminal photomask 10 and the stage 8 of the conveying device 1. The signal terminal lens assembly 11 forms a same-size erect image of the signal terminal mask pattern 13 formed on the signal terminal photomask 10, on the surface of the TFT substrate 4. A plurality of unit lens groups 15 in which a plurality of convex lenses (microlenses) 14a to 14h are arranged in a normal direction to the signal terminal photomask 10 as shown in FIG. 5B are arranged in a plane in parallel with the signal terminal photomask 10 and the stage 8 in the signal terminal lens assembly 11. The signal terminal lens assembly 11 is moved in a plane in parallel with the signal terminal photomask 10 and the stage 8 by the moving device 12 described later in a direction (direction indicated by an arrow B in FIG. 1) opposite to the substrate conveying direction indicated by the arrow A in FIG. 1.

The signal terminal lens assembly 11 has a specific configuration example in which, as shown in FIG. 5A, three lens columns 16 are provided, in each of which a plurality of unit lens groups 15 are arranged with a pitch $P_1$ (for example, 150 µm pitch) in a direction perpendicular to the moving direction of the signal terminal lens assembly 11 (a direction indicated by an arrow B in FIG. 5A). The lens columns 16 are provided with a pitch $P_2$ (for example, 150 μm pitch) in the moving direction indicated by the arrow B. Each of the lens column 16 is shifted from an adjacent lens column 16 by 1/n of the arrangement pitch $P_1$ of the plurality of unit lens groups 15 (n is an integer greater than or equal to 2 and n=3 in FIG. 5A) in the arrangement direction of the unit lens groups 15 so that a part of each unit lens group 15 of each lens columns 16 overlaps each other as seen from the moving direction (the direction indicated by the arrow B).

As shown in FIG. 5B, the signal terminal lens assembly 11 is formed by overlapping and joining a first, a second, a third, and a fourth lens arrays 18a to 18d, in each of which a plurality of convex lenses 14 are formed on both surfaces of a transparent substrate 17 in a state in which the convex lenses 14 on the upper surface and the convex lenses 14 on the lower surface correspond to each other, in a state in which corresponding convex lenses 14 have the same optical axis. Furthermore, the signal terminal lens assembly 11 is formed so that an intermediate inverted image of the signal terminal mask pattern 13 of the signal terminal photomask 10 is formed between the second lens array 18b and the third lens array 18c. In this case, eight convex lenses 14a to 14h arranged to have the same optical axis form a unit lens group 15.

Here, function of each convex lens 14 in the unit lens group 15 will be described. First, the front convex lens 14a of the first lens array 18a is a field lens for collecting a main light beam of incident light onto the surface of the rear convex lens 14b of the first lens array 18a in order to increase the amount of exposure light which passes through the signal terminal photomask 10 and which is taken into the unit lens group 15. The rear convex lens 14b of the first lens array 18a and the front convex lens 14c of the second lens array 18b are imaging lenses which cooperate with each other to form an image of the signal terminal mask pattern 13 of the signal terminal photomask 10 between the second lens array 18b and the third lens array 18c and generate an intermediate inverted image of the signal terminal mask pattern 13. Furthermore, the rear convex lens 14d of the second lens array 18b is a field lens for converting the main light beam of the incident light into a light beam parallel with the optical axis. The front convex lens 14e of the third lens array 18c is a field lens for collecting the main light beam of the incident light onto the surface of the rear convex lens 14f of the third lens array 18c. Furthermore, the rear convex lens 14f of the third lens array 18c and the front convex lens 14g of the fourth lens array 18d are imaging lenses which cooperate with each other to form the intermediate inverted image of the signal terminal mask pattern 13 on the surface of the TFT substrate 4 and generate an erect image of the signal terminal mask pattern 13. The rear convex lens 14h of the fourth lens array 18d is a field lens for converting the main light beam of the incident light into a light beam parallel with the optical axis. Thereby, it is possible to form a same-size erect image of the signal terminal mask pattern 13 of the signal terminal photomask 10 on the surface of the TFT substrate 4 by the unit lens group 15.

As shown in FIG. 5B, in the signal terminal lens assembly 11, a first aperture stop 19 including an opening 20 having a predetermined shape is provided near the surface of the front convex lens 14e of the third lens array 18c, so that an exposure area by the unit lens group 15 is limited to a central portion of the lens. Thereby, it is possible to expose an image of the signal terminal mask pattern 13 of the signal terminal photomask 10 with high resolving power while eliminating the effect of lens aberration.

Figure 6:
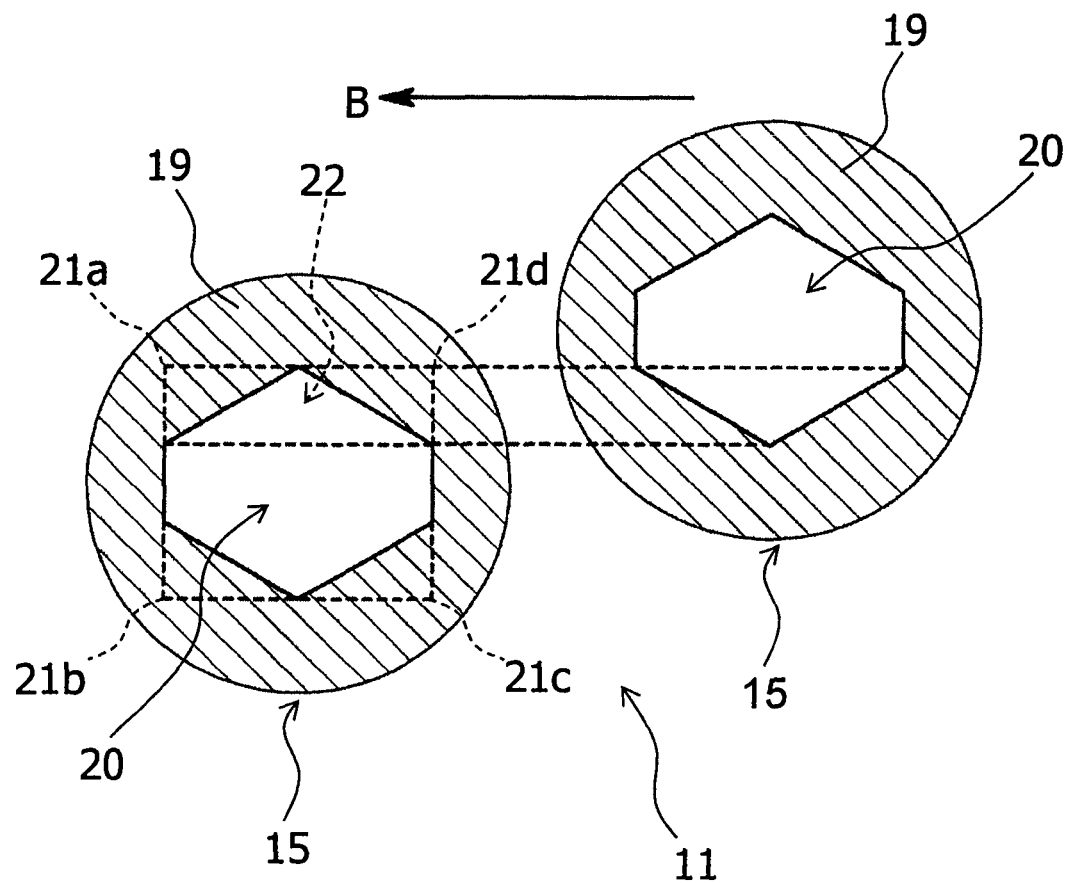
FIG. 6 is a plan view for explaining a first aperture stop opening of the signal terminal lens assembly.

In this case, as shown in FIG. 6, the opening 20 of the first aperture stop 19 has a shape, a part of which is a light-shielding portion, so that, in an opening having a rectangular shape in a planar view including four corners 21a, 21b, 21c, and 21d, an area corresponding to a portion (hereinafter referred to as "overlapping portion 22") overlapping a part of the opening 20 of an adjacent first aperture stop 19 as seen from the moving direction of the signal terminal lens assembly 11 (direction indicated by an arrow B) is a half of the entire area of the overlapping portion 22. In the present embodiment, as shown in FIG. 5A, the opening 20 of the first aperture stop 19 has a hexagonal shape having corners on the center line of the lens column 16. Thereby, the area corresponding to the overlapping portion 22 of the opening 20 of the first aperture stop 19 is a half of the entire area of the overlapping portion 22, so that the average amount of exposure of the area corresponding to the overlapping portion 22 is a half of a predetermined amount of exposure. Therefore, a predetermined amount of exposure is performed on the area corresponding to the overlapping portion 22 by repeated exposure of two unit lens groups 15 located adjacent to each other in the moving direction of the signal terminal lens assembly 11 (direction indicated by the arrow B). Hence, there is no possibility that the area corresponding to the overlapping portion 22 is overly exposed.

Here, a mechanism in which the area corresponding to the overlapping portion 22 is exposed while the signal terminal lens assembly 11 is moved will be described in further detail with reference to FIGS. 7A and 7B.

Figure 7A:
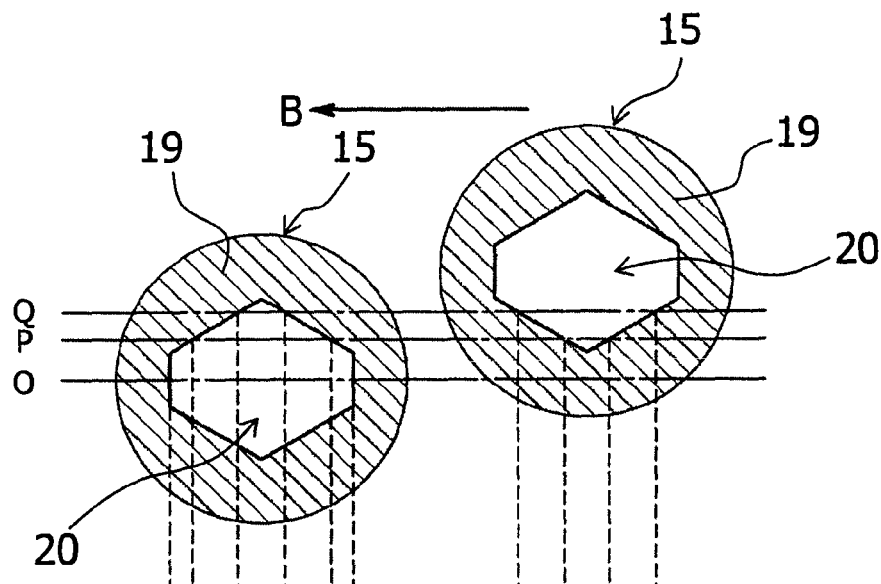
FIGS. 7A to 7D are views showing exposure by two unit lens groups adjacent to each other in a moving direction of the signal terminal lens assembly.
Figure 7B:
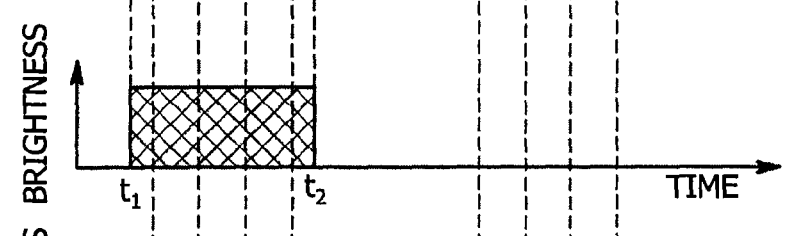

FIG. 7A is a plan view showing the unit lens groups 15 located adjacent to each other in the moving direction of the signal terminal lens assembly 11 (direction indicated by an arrow B). FIG. 7B is a view showing an exposure of a point O corresponding to a portion outside the overlapping portion 22 in FIG. 7A. In this case, the point O is limited by the opening 20 of the first aperture stop 19 and the exposure is started at $t_1$ and completed at $t_2$. Thereby, the point O is exposed to a predetermined amount of light in a time period between $t_1$ and $t_2$ and an exposure of a predetermined depth is performed.

Figure 7C:
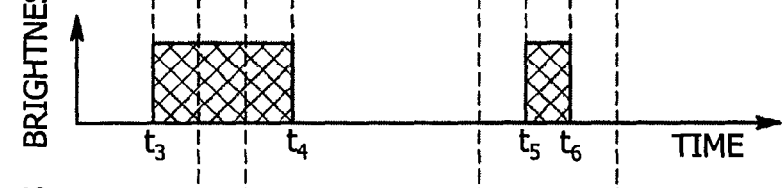

On the other hand, FIG. 7C is an illustration showing an exposure of a point P corresponding to the overlapping portion 22. In this case, the point P is limited by a portion corresponding to the overlapping portion 22 of the opening 20 of the first aperture stop 19 and the exposure is started at $t_3$ and temporarily ended at $t_4$, and thereafter the point P is limited by a portion corresponding to the overlapping portion 22 of the opening 20 of the following first aperture stop 19 and the exposure is restarted at $t_5$ and completed at $t_6$. Thereby, the point P is exposed to a predetermined amount of light in a time period between $t_3$ and $t_4$ and a time period between $t_5$ and $t_6$ and an exposure of a predetermined depth is performed.

Figure 7D:
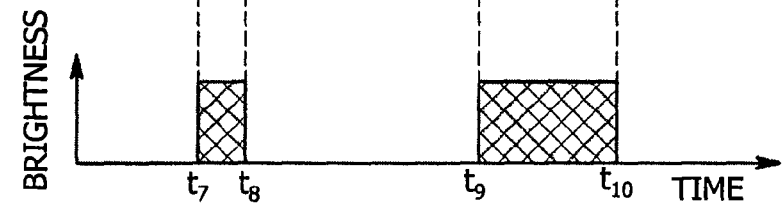

FIG. 7D is a view showing an exposure of a point Q corresponding to the overlapping portion 22. In this case, the point Q is limited by a portion corresponding to the overlapping portion 22 of the opening 20 of the first aperture stop 19 and the exposure is started at $t_7$ and temporarily ended at $t_8$, and thereafter the point Q is limited by a portion corresponding to the overlapping portion 22 of the opening 20 of the following first aperture stop 19 and the exposure is restarted at $t_9$ and completed at $t_{10}$. Thereby, the point Q is exposed to a predetermined amount of light in a time period between $t_7$ and $t_8$ and a time period between $t_9$ and $t_{10}$ and an exposure of a predetermined depth is performed.

Figure 8A:
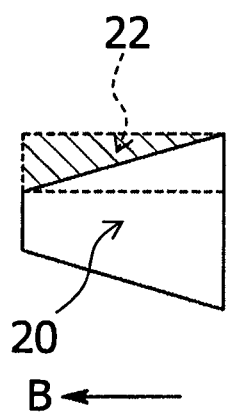
FIGS. 8A to 8C are plan views showing another shape of the first aperture stop opening.
Figure 8B:
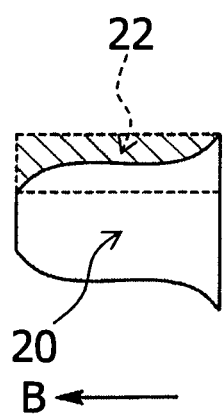
Figure 8C:
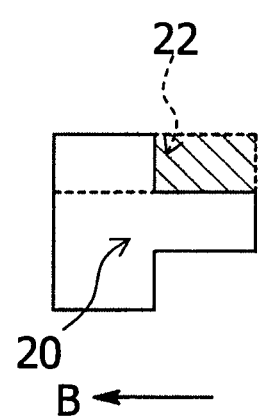

The shape of the opening 20 of the first aperture stop 19 is not limited to the hexagonal shape, but any shape may be used if a part of the shape shields light so that the area of a portion corresponding to the overlapping portion 22 of the opening 20 of the first aperture stop 19 is a half of the entire area of the overlapping portion 22. For example, as shown in FIGS. 8A to 8C, various shapes such as a trapezoidal shape may be used.

As shown in FIG. 5B, in the signal terminal lens assembly 11, a second aperture stop 23 including an opening having an elliptical shape corresponding to the opening 20 of the first aperture stop 19 is provided near the surface of the convex lens 14g on the upstream side of the light propagation direction of the fourth lens array 18d, so that the diameter of light flux passing through the unit lens group 15 is limited.

Furthermore, the signal terminal lens assembly 11 is formed so that light around the front convex lens 14a of the first lens array 18a is shielded and the width $w_1$ in the moving direction indicated by the arrow 13 in FIG. 5A (direction opposite to the direction indicated by the arrow A) of upstream and downstream areas other than a lens forming area enclosed by a solid bolded line in FIG. 5A in the moving direction is at least the same as the width $W_1$ (see FIG. 4) in the direction indicated by the arrow A of a forming area of the signal terminal mask pattern 13 of the signal terminal photomask 10. Thereby, it is possible to completely shield light passing through the signal terminal photomask 10 before the signal terminal lens assembly 11 moves and after the signal terminal lens assembly 11 has moved.

The moving device 12 is provided to move the signal terminal lens assembly 11. The moving device 12 moves the signal terminal lens assembly 11 in a plane in parallel with the signal terminal photomask 10 and the stage 8 in the direction indicated by the arrow B in FIG. 1. For example, the moving device 12 is an electromagnetic actuator or an electromotive stage.

The second exposure optical unit 3 is provided above the stage 8 on the downstream side of the first exposure optical unit 2 in the substrate conveying direction. The second exposure optical unit 3 exposes a pattern of scanning terminals on the area of the TFT substrate 4 and includes a light source device 23, a scanning terminal photomask 24, a scanning terminal lens assembly 25, and a moving device 26.

Here, the light source device 23 irradiates parallel light having a uniform brightness distribution to the scanning terminal photomask 24 described later. In the same manner as the light source device 9 of the first exposure optical unit 2, the light source device 23 includes, for example, a light source such as an extra high pressure mercury lamp and a xenon lamp, a photo integrator for uniformizing the brightness distribution of light irradiated from the light source, and a condenser lens for converting the light, of which brightness distribution is uniformized, into parallel light.

Figure 9:
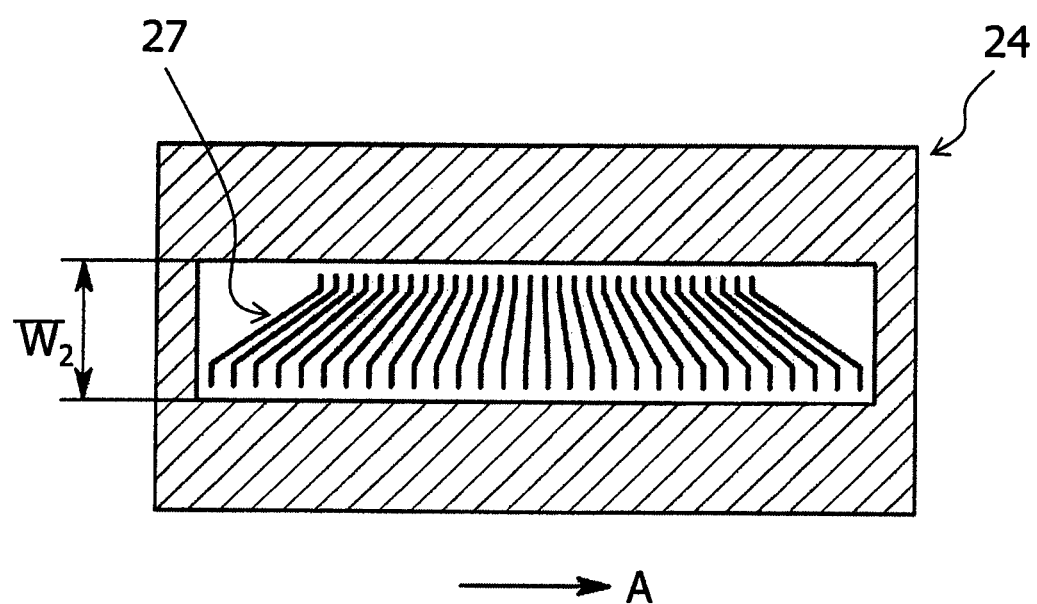
FIG. 9 is a plan view showing a configuration example of a scanning terminal photomask used in the exposure apparatus of the present invention.

The scanning terminal photomask 24 is provided on the downstream side of the light of the light source device 23. As shown in FIG. 9, in the scanning terminal photomask 24, a scanning terminal mask pattern 27 having the same shape as that of the scanning terminals on a surface of a transparent substrate is formed. The scanning terminal photomask 24 is held on a mask stage not shown in the drawings with the surface on which the scanning terminal mask pattern 27 is formed facing down. In the same manner as the signal terminal mask pattern 13, the scanning terminal photomask 24 is classified into a positive type and a negative type according to the type of photosensitive resin to be used. Here, a case in which the scanning terminal photomask 24 is positive type will be described. Therefore, the scanning terminal mask pattern 27 is formed of an opaque film and light passes through an area outside the scanning terminal mask pattern 27.

The scanning terminal lens assembly 25 is provided between the scanning terminal photomask 24 and the stage 8 of the conveying device 1. The scanning terminal lens assembly 25 forms a same-size erect image of the scanning terminal mask pattern 27 formed on the scanning terminal photomask 24 on the surface of the TFT substrate 4. As shown in FIG. 10B, a plurality of unit lens groups 29 in which a plurality of convex lenses (microlenses) 28a to 28h are arranged in a normal direction to the scanning terminal photomask 24 are arranged in a plane in parallel with the scanning terminal photomask 24 and the stage 8 in the scanning terminal lens assembly 25. The scanning terminal lens assembly 25 is moved in a plane in parallel with the scanning terminal photomask 24 and the stage 8 by the moving device 26 described later in a direction indicated by an arrow C shown in FIG. 2 (direction perpendicular to the substrate conveying direction indicated by the arrow A).

Figure 10A:
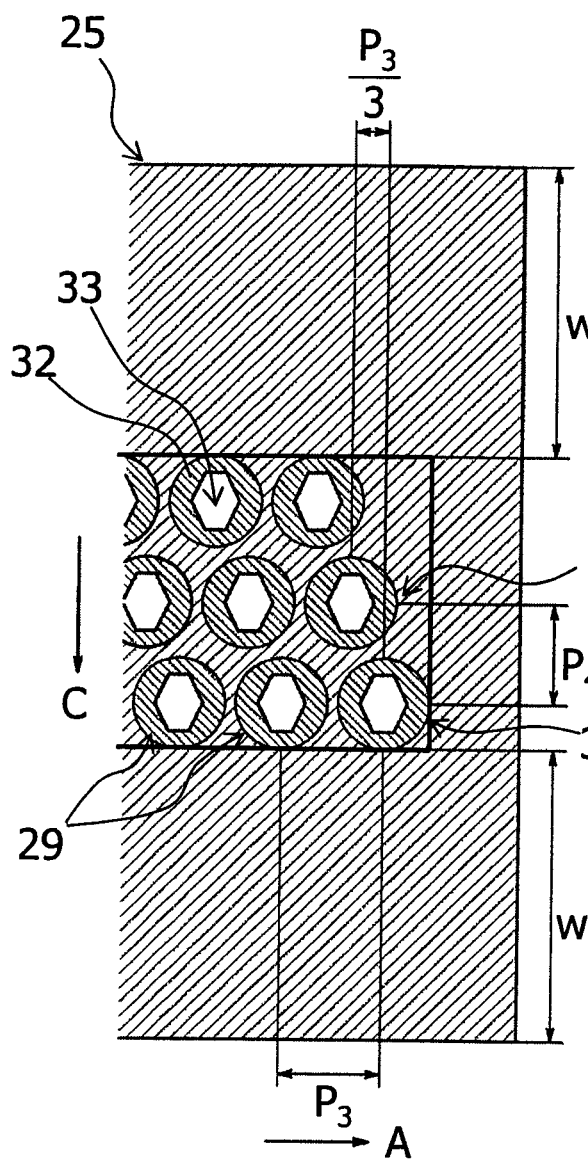
FIGS. 10A and 10B are views showing a configuration example of a scanning terminal lens assembly used in the exposure apparatus of the present invention.
Figure 10B:
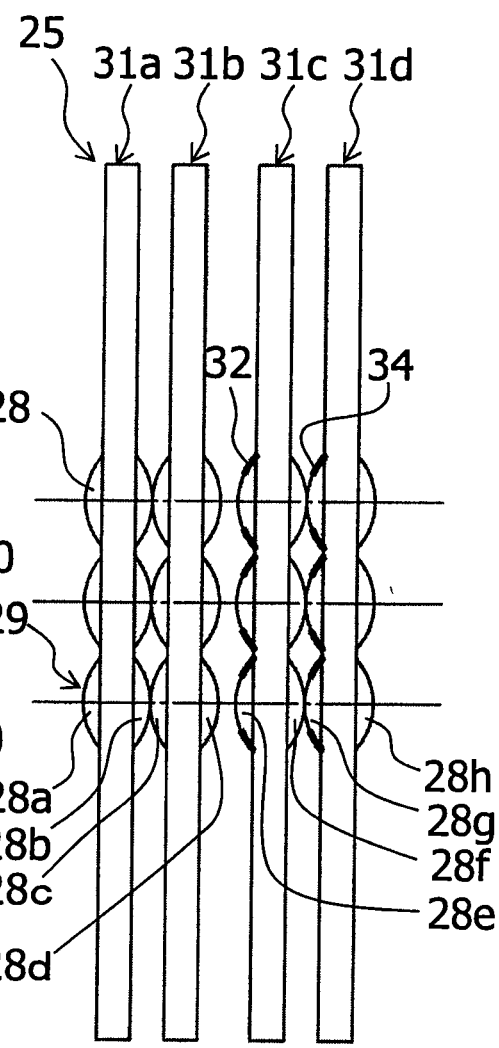

As shown in FIG. 10A, the scanning terminal lens assembly 25 has a specific configuration example in which three lens columns 30 are provided, in each of which a plurality of unit lens groups 29 are arranged with a pitch $P_3$ (for example, 150 μm pitch) in a direction perpendicular to the moving direction of the scanning terminal lens assembly 25 (a direction indicated by an arrow C in FIG. 10A). The lens columns 30 are provided with a pitch $P_4$ (for example, 150 μm pitch) in the moving direction indicated by the arrow C. Each of the lens column 30 is shifted from an adjacent lens column 30 by 1/m of the arrangement pitch $P_3$ of the plurality of unit lens groups 29 (m is an integer greater than or equal to 2 and m=3 in FIG. 10A) in the arrangement direction of the unit lens groups 29 so that a part of each unit lens group 29 of each lens column 30 overlaps each other as seen from the moving direction (the direction indicated by the arrow C).

As shown in FIG. 10B, the scanning terminal lens assembly 25 is formed by overlapping and joining a first, a second, a third, and a fourth lens arrays 31a to 31d, in each of which a plurality of convex lenses 28 are formed on both surfaces of a transparent substrate in a state in which the convex lenses 28 on the upper surface and the convex lenses 28 on the lower surface correspond to each other, in a state in which corresponding convex lenses 28 have the same optical axis. Furthermore, the scanning terminal lens assembly 25 is formed so that an intermediate inverted image of the scanning terminal mask pattern 27 of the scanning terminal photomask 24 is formed between the second lens array 31b and the third lens array 31c. In this case, eight convex lenses 28a to 28h arranged to have the same optical axis form a unit lens group 29. The configuration of the scanning terminal lens assembly 25 is the same as that of the signal terminal lens assembly 11 of the first exposure optical unit 2, so that the description of the specific configuration of the unit lens group 29 and functions of each convex lens 28 will be omitted here. In FIG. 10B, reference numeral 32 denotes a first aperture stop, reference numeral 33 denotes an opening of the first aperture stop 32, and reference numeral 34 denotes a second aperture stop.

Furthermore, the scanning terminal lens assembly 25 is formed so that light around the front convex lens 28a of the first lens array 31a is shielded and the width $w_2$ in the moving direction indicated by the arrow C in FIG. 10A of upstream and downstream areas other than a lens forming area enclosed by a solid bolded line in FIG. 10A in the moving direction is at least the same as the width $W_2$ (see FIG. 9) in a direction perpendicular to the direction indicated by the arrow A of a forming area of the scanning terminal mask pattern 27 of the scanning terminal photomask 24. Thereby, it is possible to completely shield light passing through the scanning terminal photomask 24 before the scanning terminal lens assembly 25 moves and after the scanning terminal lens assembly 25 has moved.

The moving device 26 is provided to move the scanning terminal lens assembly 25. The moving device 26 moves the scanning terminal lens assembly 25 in a plane in parallel with the scanning terminal photomask 24 and the stage 8 in the direction indicated by the arrow C in FIG. 2. For example, the moving device 26 is an electromagnetic actuator or an electromotive stage.

Next, an operation of the exposure apparatus configured as described above will be described.

First, the TFT substrate 4 on which exposure patterns of the signal lines and the scanning lines are formed in the display area 5 in advance by another exposure apparatus is positioned and placed at a predetermined position on the stage 8. Thereafter, the conveying device 1 is driven to move the stage 8 at a constant speed in the direction indicated by the arrow A in FIG. 1, so that the TFT substrate 4 is moved in the direction indicated by the arrow A. At this time, the light sources of the first and the second exposure optical units 2 and 3 are turned on.

Next, a reference mark (not shown in the drawings) provided on the TFT substrate 4 in advance is detected by an imaging device (not shown in the drawings) provided on the upstream side of the first exposure optical unit 2 in the substrate conveying direction and the moving distance of the stage 8 is measured by an position sensor on the basis of a position of the stage 8 at the time when the reference mark is detected. When the stage 8 is moved by a predetermined distance and the signal terminal forming area 6 of the TFT substrate 4 reaches immediately below the signal terminal photomask 10 of the first exposure optical unit 2, the movement of the stage 8 is stopped.

Subsequently, the moving device 12 of the first exposure optical unit 2 is driven and the signal terminal lens assembly 11 begins to move in the direction indicated by the arrow B in FIG. 1, a same-size erect image of the signal terminal mask pattern 13 of the signal terminal photomask 10 shown in FIG. 4 is projected onto the surface of the TFT substrate 4 by a plurality of unit lens groups 15 (see FIGS. 5A and 5B) moving continuously in the direction indicated by the arrow B, and an exposure pattern of the signal terminals is formed on the signal terminal forming area 6 of the TFT substrate 4.

At this time, as shown in FIG. 6, an area corresponding to the overlapping portion 22 in the exposure area limited by the opening 20 of the first aperture stop 19 of the unit lens group 15 is repeatedly exposed by two unit lens groups 15 located adjacent to each other in the moving direction (indicated by the arrow B in FIG. 6) of the signal terminal lens assembly 11. Thereby, the exposure pattern of the signal terminals is continuously connected without interruption. In this case, the portion corresponding to the overlapping portion 22 in the opening 20 of the first aperture stop 19 is formed so that the area thereof is a half of the entire area of the overlapping portion 22, and thus, an exposure of a predetermined depth is performed by the repeated exposure of the two unit lens groups 15 and there is no possibility of over exposure.

When the signal terminal lens assembly 11 moves by a predetermined distance and the entire exposure pattern of the signal terminal mask pattern 13 is formed on the signal terminal forming area 6 of the TFT substrate 4, the moving device 12 stops, the stage 8 begins to move, and the conveyance of the TFT substrate 4 is restarted.

Furthermore, when the TFT substrate 4 moves by a predetermined distance and a scanning terminal forming area 7 of the TFT substrate 4 reaches immediately below the scanning terminal photomask 24 of the second exposure optical unit 3, the movement of the stage 8 is stopped.

Subsequently, the moving device 26 of the second exposure optical unit 3 is driven and the scanning terminal lens assembly 25 begins to move in the direction indicated by the arrow C in FIG. 2, a same-size erect image of the scanning terminal mask pattern 27 of the scanning terminal photomask 24 shown in FIG. 9 is projected onto the surface of the TFT substrate 4 by a plurality of unit lens groups 29 (see FIGS. 10A and 10B) moving continuously in the direction indicated by the arrow C, and an exposure pattern of the scanning terminals is formed on the scanning terminal forming area 7 of the TFT substrate 4.

At this time, in the same manner as in the case of the signal terminal lens assembly 11 of the first exposure optical unit 2 shown in FIG. 6, an area corresponding to the overlapping portion in the exposure area limited by the opening 33 of the first aperture stop 32 of the unit lens group 29 is repeatedly exposed by two unit lens groups 29 located adjacent to each other in the moving direction (indicated by the arrow C in FIG. 10A) of the scanning terminal lens assembly 25. Thereby, the exposure pattern of the scanning terminals is continuously connected without interruption. In this case, in the same manner as in the first aperture stop 19 of the first exposure optical unit 2, the portion corresponding to the overlapping portion in the opening 33 of the first aperture stop 32 is formed so that the area thereof is a half of the entire area of the overlapping portion, and thus, an exposure of a predetermined depth is performed by the repeated exposure of the two unit lens groups 29 and there is no possibility of over exposure.

When the scanning terminal lens assembly 25 moves by a predetermined distance and the entire exposure pattern of the scanning terminal mask pattern 27 is formed on the scanning terminal forming area 7 of the TFT substrate 4, the moving device 26 stops and all the exposure to the TFT substrate 4 is completed. Thereafter, the movement of the stage 8 is restarted and the TFT substrate 4 is conveyed to the outside.

Although, in the above embodiment, a case is described in which the signal terminal lens assembly 11 includes one set of three lens columns 16 and the scanning terminal lens assembly 25 includes one set of three lens columns 30, the present invention is not limited to this, and a plurality of sets of three lens columns 16 and a plurality of sets of three lens columns 30 may be provided in the moving directions (directions indicated by the arrows B and C) of the signal terminal lens assembly 11 and the scanning terminal lens assembly 25, respectively. In this case, multiple exposure is performed by the unit lens groups 15 and 29 located on a line parallel with the moving direction. Thereby, it is possible to increase the moving speed of the signal terminal lens assembly 11 and the scanning terminal lens assembly 25 and shorten the tact time of the exposure process. Furthermore, the power of the light source to be used can be small.

Figure 11:
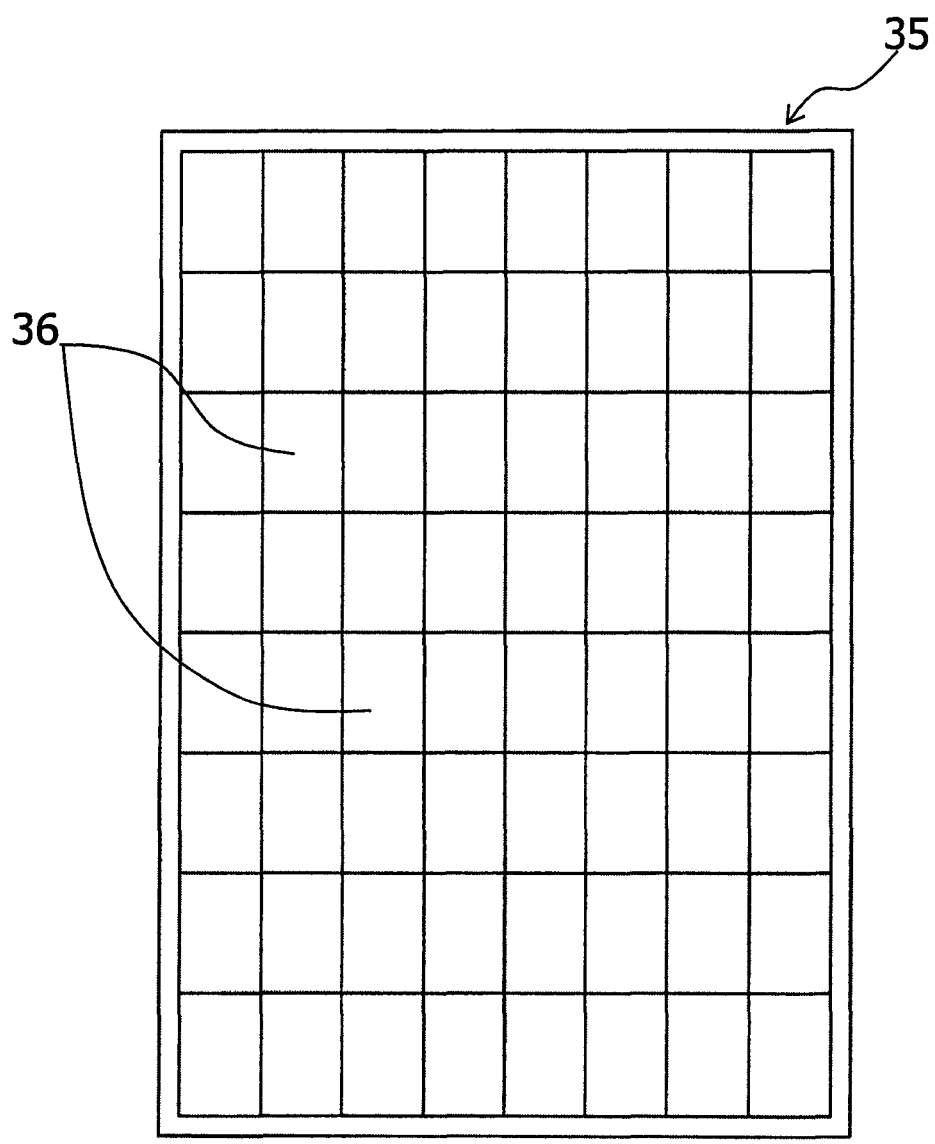
FIG. 11 is a plan view showing a large area substrate on which multiple display panels are attached and which is a substrate used in the exposure apparatus of the present invention.
Figure 12:
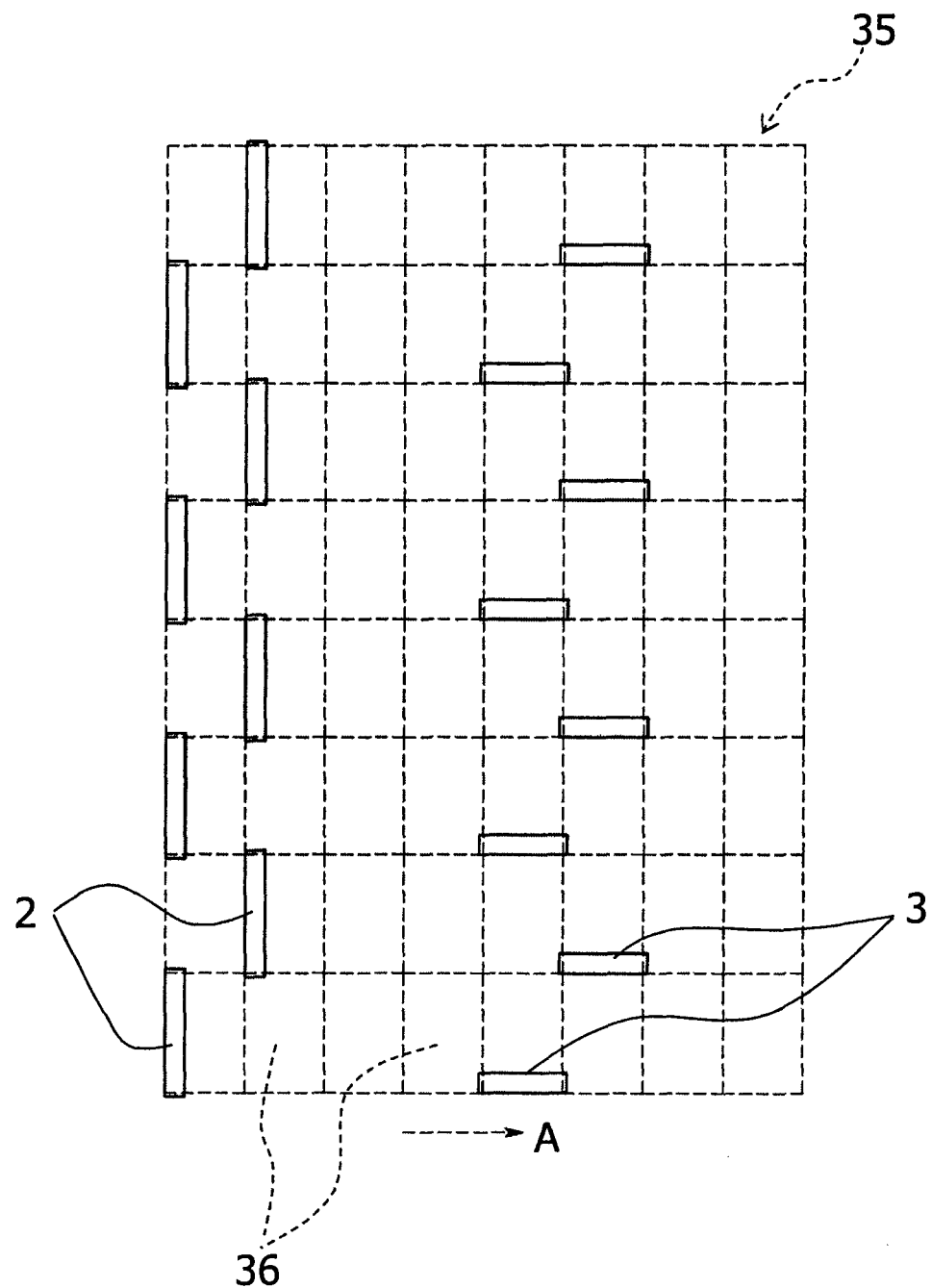
FIG. 12 is a plan view showing an arrangement of exposure optical units in the exposure apparatus of the present invention and showing an arrangement example on the large area substrate of FIG. 11.
Figure 13A:
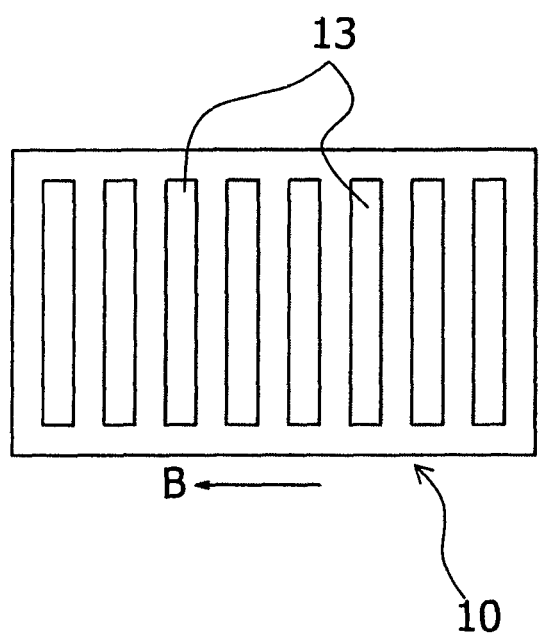
FIGS. 13A and 13B are schematic plan views showing an example in which multiple types of mask patterns are formed in one photomask.
Figure 13B:
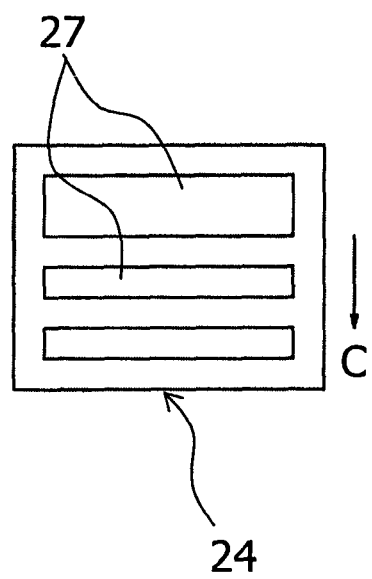

Although, in the above embodiment, a case is described in which exposure patterns of the signal terminals and the scanning terminals are formed on one TFT substrate 4 for a liquid crystal display, the present invention is not limited to this, and the present invention can be applied to a case in which exposure patterns of the signal terminals and the scanning terminals are formed on a plurality of display panels 36 (8 panels wide×8 panels high are shown in FIG. 11) attached to a large area substrate 35 as shown in FIG. 11. In this case, as shown in FIG. 12, eight first exposure optical units 2 and eight second exposure optical units 3 may be provided in a staggered manner with respect to each display panel 36 in a direction perpendicular to the substrate conveying direction (indicated by the arrow A). When pattern shapes of the signal terminals or the scanning terminals of each display panel 36 are different from each other, a signal terminal photomask 10 including a plurality of types of signal terminal mask patterns 13 as shown in FIG. 13A and a scanning terminal photomask 24 including a plurality of types of scanning terminal mask patterns 27 as shown in FIG. 13B may be used.

Here, in a case in which shapes of the signal terminals and the scanning terminals of each display panel 36 are different from each other, when the exposure, for example, using the signal terminal mask pattern 13 of the signal terminal photomask 10, to a predetermined display panel 36 is completed, the substrate 35 is moved by a predetermined distance, and thereafter the signal terminal photomask 10 is moved in the direction indicated by the arrow B and the signal terminal mask pattern 13 is switched to the next signal terminal mask pattern 13, and exposure is performed to another display panel 36 using the next signal terminal mask pattern 13. Thereafter, while repeating the moving and stopping of the substrate 35, the signal terminal photomask 10 is moved in the direction indicated by the arrow B and the signal terminal mask pattern 13 is switched one after another to perform exposure to a corresponding display panel 36. Similarly, in the case of the scanning terminal photomask 24, when the exposure, for example, using the scanning terminal mask pattern 27, to a predetermined display panel 36 is completed, the substrate 35 is moved by a predetermined distance, and thereafter the scanning terminal photomask 24 is moved in the direction indicated by the arrow C and the scanning terminal mask pattern 27 is switched to the next scanning terminal mask pattern 27, and exposure is performed to another display panel 36 using the next scanning terminal mask pattern 27. Furthermore, the scanning terminal mask pattern 27 may be switched to another scanning terminal mask pattern 27 and exposure may be performed to another display panel 36 using the other scanning terminal mask pattern 27.

Although, in the above embodiment, a case is described in which the TFT substrate 4 is a substrate in which an exposure pattern of a plurality of signal lines and scanning lines crisscrossing each other is formed in the display area 5 by another exposure apparatus, the present invention is not limited to this, and a third exposure optical unit for forming the above-mentioned exposure pattern of signal lines and scanning lines on the TFT substrate 4 may be provided on the upstream side of the first exposure optical unit 2 in the substrate conveying direction. In this case, it is preferred that the third exposure optical unit should be an exposure optical unit in which two mask pattern groups including two types of mask patterns having different required resolving powers such as electrode wiring, signal lines, and scanning lines of a thin film transistor are formed on a light-shielding film which is formed on one surface of a transparent substrate along the conveying direction of the TFT substrate 4, a photomask on which microlenses for projecting a reduced image of a mask pattern corresponding to a mask pattern of electrode wiring of a thin film transistor having higher required resolving power of the two types of mask patterns having different required resolving powers onto the TFT substrate 4 are formed, is arranged on the other surface so that the microlenses face the TFT substrate 4, and light from a light source is intermittently irradiated to the photomask at predetermined time intervals and the two types of mask patterns of the photomask are exposed to the TFT substrate 4 that is being conveyed at a constant speed in the direction indicated by the arrow A in FIG. 1 at a predetermined cycle.

The photomask used here may have a specific configuration in which, in a direction in which a mask pattern group including electrode wiring mask patterns of a thin film transistor having high required resolving power is substantially perpendicular to the conveying direction of the TFT substrate 4 (direction indicated by the arrow A), a plurality of mask pattern columns are formed by linearly aligning the plurality of mask patterns at a predetermined pitch, and in order to be possible to complement spaces between a plurality of exposure patterns formed by a mask pattern column located downstream in the conveying direction of the TFT substrate 4 with a plurality of exposure patterns formed by a subsequent mask pattern column, the subsequent mask pattern column is formed by being shifted by a predetermined distance in an alignment direction of the plurality of mask patterns.

Furthermore, although, in the above embodiment, a case is described in which exposure is performed while the TFT substrate 4 is moved in one direction, the present invention is not limited to this, and exposure may be performed while the TFT substrate 4 is moved step by step in a two-dimensional plane.

Although, in the above description, a case is described in which the object to be exposed is the TFT substrate 4, the present invention is not limited to this, and any object to be exposed may be used if non-periodic pattern is formed on the object to be exposed.

It should be noted that the entire contents of Japanese Patent Application No. 2009-275455, filed on Dec. 3, 2009, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

What is claimed is:

1. An exposure apparatus comprising:
    a stage on which an object to be exposed is held and that conveys the object to be exposed in one direction;
    a photomask on which a mask pattern having the same shape as that of an exposure pattern exposed onto a surface of the object to be exposed held on the stage is formed;
    a lens assembly which is disposed between the photomask and the stage and in which a plurality of unit lens groups in each of which a plurality of convex lenses are arranged in a normal direction to the photomask so that a same-size erect image of the mask pattern formed on the photomask can be formed on the surface of the object to be exposed are arranged in a plane parallel with the photomask and the surface of the object to be exposed held on the stage; and
    a moving device that moves the lens assembly in a plane parallel with the photomask and the surface of the object to be exposed held on the stage, in a state in which movement of the stage is stopped.

2. The exposure apparatus according to claim 1, wherein the lens assembly includes a plurality of lens columns in each of which a plurality of the unit lens groups are arranged at a predetermined pitch in a direction perpendicular to a moving direction of the lens assembly, the plurality of lens columns are provided at a predetermined pitch in the moving direction, and each lens column is shifted from an adjacent lens column by a predetermined distance in an arrangement direction of the unit lens groups so that a part of each unit lens group of each lens columns overlaps each other as seen from the moving direction.

3. The exposure apparatus according to claim 1, wherein the lens assembly is formed by overlapping a first, a second, a third, and a fourth lens array arrays in each of which a plurality of convex lenses are formed on both surfaces of a transparent substrate in a state in which the convex lenses on the upper surface and the convex lenses on the lower surface correspond to each other, in a state in which corresponding convex lenses have the same optical axis, and the lens assembly is formed so that an intermediate inverted image of the mask pattern of the photomask is formed between the second lens array and the third lens array.

4. The exposure apparatus according to claim 3, wherein the lens assembly includes a first aperture stop including an opening having a predetermined shape near a surface of a convex lens located upstream in a light propagation direction of the third lens array, so that an exposure area by the unit lens is limited to a central portion of the lens.

5. The exposure apparatus according to claim 4, wherein the opening of the first aperture stop has a shape, a part of which is a light shielding portion, so that, in an opening having a rectangular shape in a planar view, an area of a portion overlapping a part of an opening of an adjacent first aperture stop as seen from the moving direction of the lens assembly is a half of the entire area of the overlapping portion.

6. The exposure apparatus according to claim 3, wherein the lens assembly includes a second aperture stop which limits a diameter of light flux near a surface of a lens on the upstream side of the fourth lens array in a light propagation direction.

7. The exposure apparatus according to claim 1, further comprising another photomask in which a plurality of other mask patterns are formed by arranging the mask patterns in at least one column at predetermined intervals in a direction perpendicular to the conveying direction of the object to be exposed on a light-shielding film formed on one surface of a transparent substrate above the stage on the upstream side of the photomask in the conveying direction of the object to be exposed, wherein light from a light source is intermittently irradiated to the another photomask at predetermined time intervals and images of the mask patterns are exposed to the object to be exposed that is being conveyed at a constant speed at a predetermined cycle.

8. The exposure apparatus according to claim 7, wherein in the another photomask, two mask pattern groups including two types of mask patterns having different required resolving powers are formed on a light-shielding film formed on a surface of a transparent substrate opposite to a surface facing the object to be exposed along the conveying direction of the object to be exposed, and microlenses, which project projects a reduced image of a mask pattern corresponding to a mask pattern having higher required resolving power of the two types of mask patterns having different required resolving powers onto the object to be exposed, are formed on the surface facing the object to be exposed.

9. The exposure apparatus according to claim 8, wherein, a mask pattern group including the mask pattern having higher required resolving power includes a plurality of mask pattern columns formed by linearly aligning the plurality of mask patterns at a predetermined pitch in a direction substantially perpendicular to the conveying direction of the object to be exposed, and a subsequent mask pattern column is formed by being shifted by a predetermined distance in an alignment direction of the plurality of mask patterns to thereby complement spaces between a plurality of exposure patterns formed by a mask pattern column located downstream in the conveying direction of the object to be exposed with a plurality of exposure patterns formed by a subsequent mask pattern column.

10. The exposure apparatus according to claim 7, wherein
the object to be exposed is a thin film transistor substrate of a display apparatus,
the another photomask is used to expose in a central display area of the thin film transistor substrate images of the two types of mask patterns having different required resolving powers at a predetermined cycle, a mask pattern having higher required resolving power of the two types of mask patterns having different required resolving powers is an electrode wiring mask pattern of a thin film transistor, and a mask pattern having lower required resolving power is a mask pattern for signal lines and scanning lines which supply signals to the thin film transistor, and
the photomask includes a mask pattern for terminals connected to the signal lines or the scanning lines in an area outside the display area of the thin film transistor substrate.

\* \* \* \* \*